United States Patent
Liu et al.

(10) Patent No.: US 11,249,364 B2
(45) Date of Patent: Feb. 15, 2022

(54) DISPLAY PANEL AND METHOD FOR MANUFACTURING FIRST SUBSTRATE THEREOF

(71) Applicants: HKC CORPORATION LIMITED, Shenzhen (CN); CHONGQING HKC OPTOELECTRONICS TECHNOLOGY CO., LTD., Chongqing (CN)

(72) Inventors: Kaijun Liu, Chongqing (CN); En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 511 days.

(21) Appl. No.: 16/311,177

(22) PCT Filed: Oct. 23, 2018

(86) PCT No.: PCT/CN2018/111333
§ 371 (c)(1),
(2) Date: Dec. 19, 2018

(87) PCT Pub. No.: WO2020/051993
PCT Pub. Date: Mar. 19, 2020

(65) Prior Publication Data
US 2021/0223589 A1 Jul. 22, 2021

(30) Foreign Application Priority Data
Sep. 11, 2018 (CN) .......................... 201811054993.5

(51) Int. Cl.
G02F 1/1368 (2006.01)
G02F 1/1362 (2006.01)
H01L 29/786 (2006.01)

(52) U.S. Cl.
CPC ...... *G02F 1/1368* (2013.01); *G02F 1/136209* (2013.01); *H01L 29/78633* (2013.01); *H01L 29/78696* (2013.01)

(58) Field of Classification Search
CPC ............. G02F 1/1368; G02F 1/136209; H01L 29/78633; H01L 29/78696
(Continued)

(56) References Cited

U.S. PATENT DOCUMENTS

2014/0027763 A1* 1/2014 Shen ................. H01L 29/78693
257/43
2014/0145180 A1 5/2014 Oh et al.
(Continued)

FOREIGN PATENT DOCUMENTS

CN 103337497 A 10/2013
CN 104393003 A 3/2015
(Continued)

OTHER PUBLICATIONS

Jiang Zhou, the ISA written comments, dated Jun. 2019, CN.

*Primary Examiner* — Charles S Chang

(57) ABSTRACT

The present application discloses a display panel and a method for manufacturing a first substrate thereof. The display panel includes a first substrate which is provided with a thin film transistor. The thin film transistor includes a gate, a source and a drain. Light shielding layers are disposed on the outer side of the source and the outer side of the drain.

20 Claims, 2 Drawing Sheets

(58) Field of Classification Search
USPC .................................. 349/42–48, 110–111
See application file for complete search history.

(56) References Cited

U.S. PATENT DOCUMENTS

| | | | |
|---|---|---|---|
| 2015/0179811 A1* | 6/2015 | Kanno | H01L 29/66969 |
| | | | 257/43 |
| 2017/0108722 A1* | 4/2017 | Gao | G02F 1/133345 |
| 2020/0075704 A1* | 3/2020 | Liu | H01L 51/56 |

FOREIGN PATENT DOCUMENTS

| CN | 104503132 A | 4/2015 |
|---|---|---|
| CN | 107086181 A | 8/2017 |
| CN | 207637799 U | 7/2018 |

* cited by examiner

DISPLAY PANEL AND METHOD FOR MANUFACTURING FIRST SUBSTRATE THEREOF

The present application claims priority to Chinese Patent Application No. CN 201811054993.5, entitled "DISPLAY PANEL AND METHOD FOR MANUFACTURING FIRST SUBSTRATE THEREOF", filed to NATIONAL INTELLECTUAL PROPERTY ADMINISTRATION, PRC on Tuesday, Sep. 11, 2018, the entire contents of which are incorporated herein by reference in the present application.

TECHNICAL FIELD

The present solution relates to the technical field of display, and in particular, to a display panel and a method for manufacturing a first substrate thereof.

BACKGROUND

Liquid crystal displays have many advantages such as thin bodies, power saving and no radiation, and have been widely used. Most of the liquid crystal displays on the market are backlight type liquid crystal displays which each include a liquid crystal panel and a backlight module. The working principle of the liquid crystal panel is that liquid crystal molecules are placed between two parallel glass substrates and a driving voltage is applied on the two glass substrates to control the rotating direction of the liquid crystal molecules, so as to refract light of the backlight module to generate a picture.

A thin film transistor-liquid crystal display (TFT-LCD) is mainly in such an arrangement that each pixel is controlled by a thin film transistor (TFT) switch, gates of the TFT switches are connected together to form a gate line, and sources are connected together to form a signal line. When a voltage is applied to the gates of the TFT, the TFT can be brought into an on state, at the same time display data reaches a drain of the drains is displayed on the drain of TFT through a signal line and the TFT that is turned on, and an electric field is formed on the pixel, and liquid crystal is charged to achieve a display effect.

After light from backlight of the exemplary liquid crystal display device is incident on the panel, the light that is diffracted or refracted by a liquid crystal layer in the panel partially enters a channel of the TFT, thereby affecting the display effect.

SUMMARY

The present application provides a display panel for reducing a leakage current and a method for manufacturing a first substrate thereof.

To achieve the above objective, the present application provides a display panel, which includes:

a first substrate, which is provided with a thin film transistor;

a second substrate disposed corresponding to the first substrate;

the thin film transistor includes a gate, a gate insulating layer disposed on the gate, an active layer, a source and a drain;

the channel direction of the thin film transistor is the inner side direction, and the direction in which the source and the drain are away from a channel is the outer side direction;

The thin film transistor is provided with insulating light-shielding layers on the outer side of the source and the outer side of the drain, respectively, in a direction away from the first substrate.

Optionally, the light-shielding layer is an insulating light-shielding layer, the source of the thin film transistor is in direct contact with the insulating light-shielding layer, and the drain of the thin film transistor is in direct contact with the insulating light-shielding layer.

Optionally, in the outer side direction of the gate of the thin film transistor, the upper surface of the gate insulating layer corresponding to one side of the source and not covered with the source is also provided with an insulating light-shielding layer.

Optionally, in the outer side direction of the gate of the thin film transistor, the upper surface of the gate insulating layer corresponding to one side of the drain and not covered with the drain is also provided with an insulating light-shielding layer.

Optionally, the insulating light-shielding layer is formed by jet with a high-precision inkjet device.

Optionally, an insulating light-shielding layer is not disposed at the channel of the thin film transistor.

Optionally, the upper surfaces of the source and the drain close to the channel are not provided with an insulating light-shielding layer, and the upper surfaces of the source and the drain away from the channel are provided with insulating light shielding layers.

Optionally, the upper surfaces of the source and the drain are not provided with an insulating light-shielding layer, and the insulating light shielding layers are disposed only on the outer side of the source and the outer side of the drain.

The present application also discloses a method for manufacturing a first substrate of a display panel, including the step of forming a thin film transistor on a first substrate;

the step of forming a thin film transistor on a first substrate includes the step of forming a gate, a gate insulating layer, an active layer, a source and a drain;

where the step of forming a thin film transistor further includes the step of forming light shielding layers on the outer side of the source and the outer side of the drain of the thin film transistor in a direction away from the first substrate, the channel direction of the thin film transistor is the inner side direction, and the direction in which the source and the drain are away from the channel is the outer side direction.

Optionally, the step of forming a thin film transistor includes:

forming a gate, a gate insulating layer, an active layer, a source and a drain; and spaying insulating light-shielding layers on the outer side of the source and the outer side of the drain by a high-precision inkjet device, respectively.

The inventors have found that the larger the on state current of the TFT of an ideal TFT-LCD, the better; and the smaller the off state current, the better. However, the display of the TFT is mainly in a "back-transparent" irradiation mode. Even if a bottom gate structure is employed, there is still some diffracted light or scattered light and the like entering the TFT channel to cause an increase in the off state leakage current, thereby affecting the display effect and even causing image sticking (IS). In this solution, the insulating light shielding layers are disposed on the outer side of the source and the outer side of the drain respectively, which can effectively prevent the light reflected from the liquid crystal layer from entering the TFT channel from the outer side of the TFT, thereby reducing the off state leakage current.

BRIEF DESCRIPTION OF DRAWINGS

The drawings are included to provide further understanding of embodiments of the present application, which constitute a part of the specification and are also examples of embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

Figure 1:
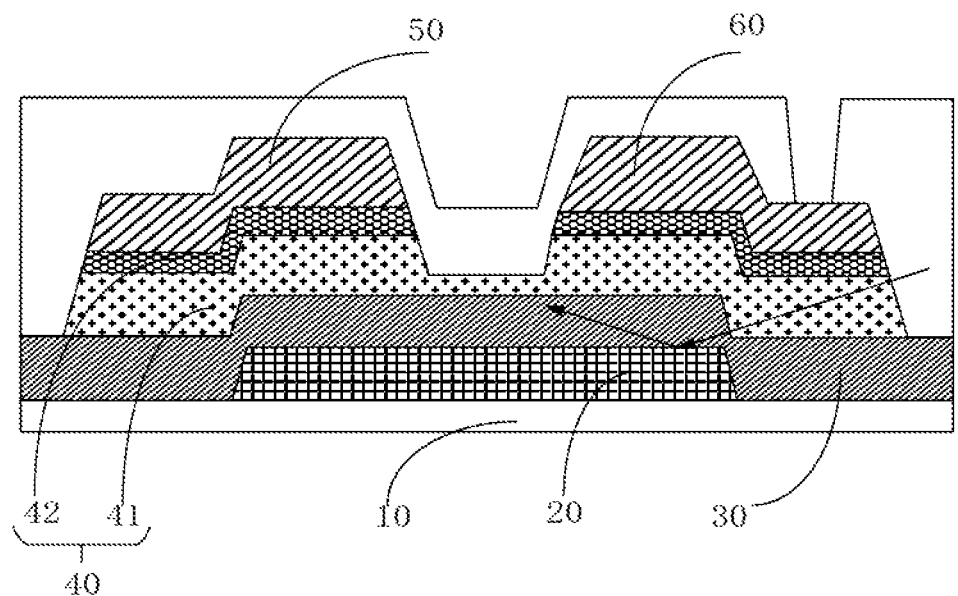
FIG. 1 is a schematic view of a display panel according to an embodiment of the present application.

The specific structure and function details disclosed herein are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

In the figures, structurally similar units are denoted by the same reference numerals.

Figure 2:
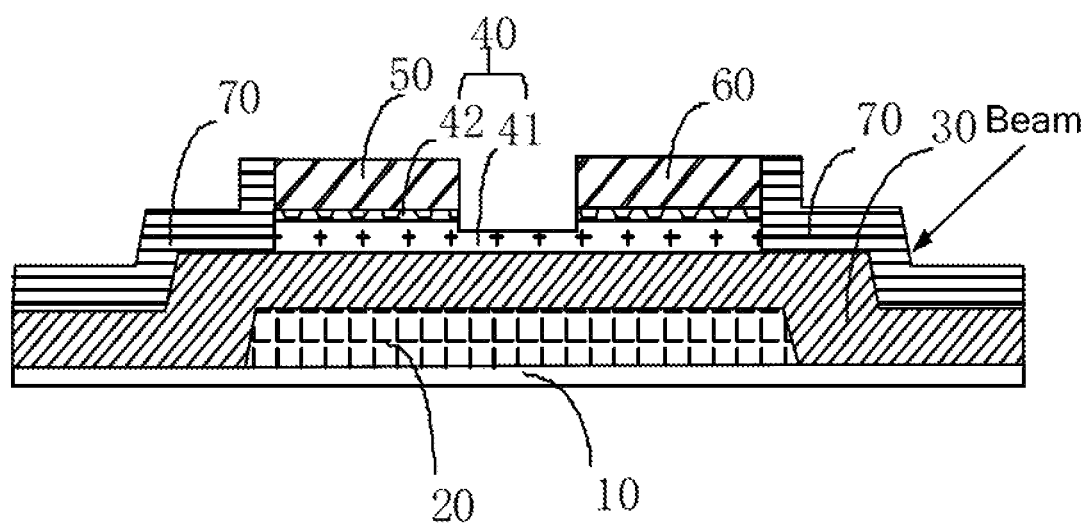
FIG. 2 is a schematic view of a coated insulating light-shielding layer according to an embodiment of the present application.
Figure 3:
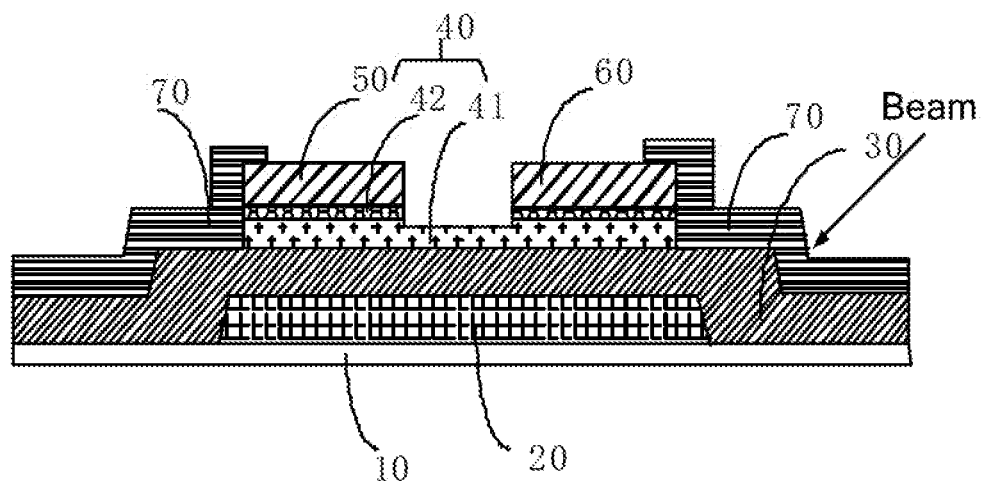
FIG. 3 is a schematic view of another coated insulating light-shielding layer according to an embodiment of the present application.

As shown in FIG. 1 to FIG. 3, an embodiment of the present application discloses a display panel, including:

a first substrate 10, where the first substrate 10 is provided with a thin film transistor;

a second substrate disposed corresponding to the first substrate 10;

the thin film transistor includes a gate 20, a gate insulating layer 30 disposed on the gate 20, an active layer 40, a source 50 and a drain 60;

the channel direction of the thin film transistor is the inner side direction, and the direction in which the source 50 and the drain 60 are away from a channel is the outer side direction;

In a direction far away from the first substrate 10, the thin film transistor is provided with an insulating light-shielding layer 70 which is disposed on the outer side of the source 50 and on the upper surface of the gate insulating layer 30 corresponding to one side of the source 50 and not covered with the source 50. An insulating light-shielding layer 70 is disposed on the outer side of the drain 60 and the upper surface of the gate insulating layer 30 corresponding to one side of the drain 60 and not covered with the drain 60. The insulating light-shielding layers 70 are formed by jet with a high-precision inkjet device.

The larger the on state current of the TFT of an ideal TFT-LCD, the better; and the smaller the off state current, the better. However, the display of the TFT is mainly in a "back-transparent" irradiation mode. Even if a bottom gate structure is employed, there is still some diffracted light or scattered light and the like entering the TFT channel to cause an increase in the off state leakage current, thereby affecting the display effect and even causing image sticking (IS). In this solution, the insulating light shielding layers 70 are disposed on the outer side of the source 50 and the outer side of the drain 60 respectively, which can effectively prevent the light reflected from the liquid crystal layer from entering the TFT channel from the outer side of the TFT, thereby reducing the off state leakage current.

The active layer includes a doped layer 42 and an amorphous silicon layer 41, and the doped layer is located over the amorphous silicon layer.

As shown in FIG. 1 to FIG. 4, another embodiment of the present application discloses a display panel, including:

a first substrate 10, where the first substrate 10 is provided with a thin film transistor;

a second substrate disposed corresponding to the first substrate 10;

the thin film transistor includes a gate, a gate insulating layer 30 disposed on the gate, an active layer 40, a source 50 and a drain 60;

the channel direction of the thin film transistor is the inner side direction, and the direction in which the source 50 and the drain 60 are away from a channel is the outer side direction;

the thin film transistor is provided with light-shielding layers on the outer side of the source 50 and the outer side of the drain 60, respectively, in a direction away from the first substrate 10.

The larger the on state current of the TFT of an ideal TFT-LCD, the better; and the smaller the off state current, the better. However, the display of the TFT is mainly in a "back-transparent" irradiation mode. Even if a bottom gate structure is employed, there is still some diffracted light or scattered light and the like entering the TFT channel to cause an increase in the off state leakage current, thereby affecting the display effect and even causing image sticking (IS). In this solution, the insulating light shielding layers 70 are disposed on the outer side of the source 50 and the outer side of the drain 60 respectively, which can effectively prevent the light reflected from the liquid crystal layer from entering the TFT channel from the outer side of the TFT, thereby reducing the off state leakage current.

In this embodiment, optionally, the light-shielding layer is an insulating light-shielding layer 70, the light-shielding layer 70 is a black matrix, the source 50 of the thin film transistor is in direct contact with the insulating light-shielding layer 70, and the drain 60 of the thin film transistor is in direct contact with the insulating light-shielding layer 70.

In this solution, the source 50 and the drain 60 of the thin film transistor are in direct contact with the insulating light-shielding layer 70, and the direct contact is the closest, so that the light shielding effect is the best.

In this embodiment, optionally, in the outer side direction of the gate of the thin film transistor, the upper surface of the gate insulating layer 30 corresponding to one side of the source 50 and not covered with the source 50 is also provided with an insulating light-shielding layer 70.

The insulating light-shielding layer 70 on one side of the source 50 covers a wider range, which can better prevent light from entering and better reduce off state leakage current.

In this embodiment, optionally, in the outer side direction of the gate of the thin film transistor, the upper surface of the gate insulating layer 30 corresponding to one side of the drain 60 and not covered with the drain 60 is also provided with an insulating light-shielding layer 70.

The insulating light-shielding layer 70 on one side of the drain 60 covers a wider range, which can better prevent light from entering and better reduce leakage current.

In this embodiment, optionally, the insulating light-shielding layer 70 is formed by jet with a high-precision inkjet device.

The jet precision of the high-precision inkjet device is 1 micron, the operation process is simpler, and the development is not exposed; of course, the insulating light-shielding layer can also be formed by exposure development.

In this embodiment, optionally, an insulating light-shielding layer 70 is not disposed at the channel of the thin film transistor.

In this solution, the channel between the source 50 and the drain 60 is not provided with the insulating light-shielding layer 70, to avoid adverse effects on the channel region in the process of processing the insulating light-shielding layer 70; especially for the solution of adopting the high-precision inkjet device to form the insulating light-shielding layer 70 by jet, since the amorphous silicon in the channel is very sensitive to materials such as water, an additional protective layer is provided to protect the channel material, and the poor treatment may cause an increase in leakage current, resulting in image sticking (IS). Therefore, the insulating light-shielding layer 70 does not coat the channel of the thin film transistor, which has the least influence on the channel region, and the process is the simplest.

In this embodiment, optionally, the upper surfaces of the source 50 and the drain 60 close to the channel are not provided with an insulating light-shielding layer 70, and the upper surfaces of the source and the drain away from the channel are provided with insulating light shielding layers 70.

In this solution, the insulating light-shielding layer 70 is not disposed on the upper surfaces of the source 50 and the drain 60 close to the channel, to avoid adverse effects of process errors on the channel region in the process of processing the insulating light-shielding layer 70; the upper surfaces of the source 50 and the drain 60 away from the channel are also provided with insulating light shielding layers 70, so that the light shielding effect at the joint of the edges of the source 50 and the drain 60 is better.

In this embodiment, optionally, the upper surfaces of the source 50 and the drain 60 are not provided with an insulating light-shielding layer 70, and the insulating light shielding layers 70 are disposed only on the outer side of the source 50 and the outer side of the drain 60.

Since the source 50 and the drain 60 have a light-shielding effect by themselves, the upper surfaces of the source 50 and the drain 60 away from the channel may be also not provided with the insulating light-shielding layer 70. Such a design has high requirements on processing accuracy.

Figure 4:
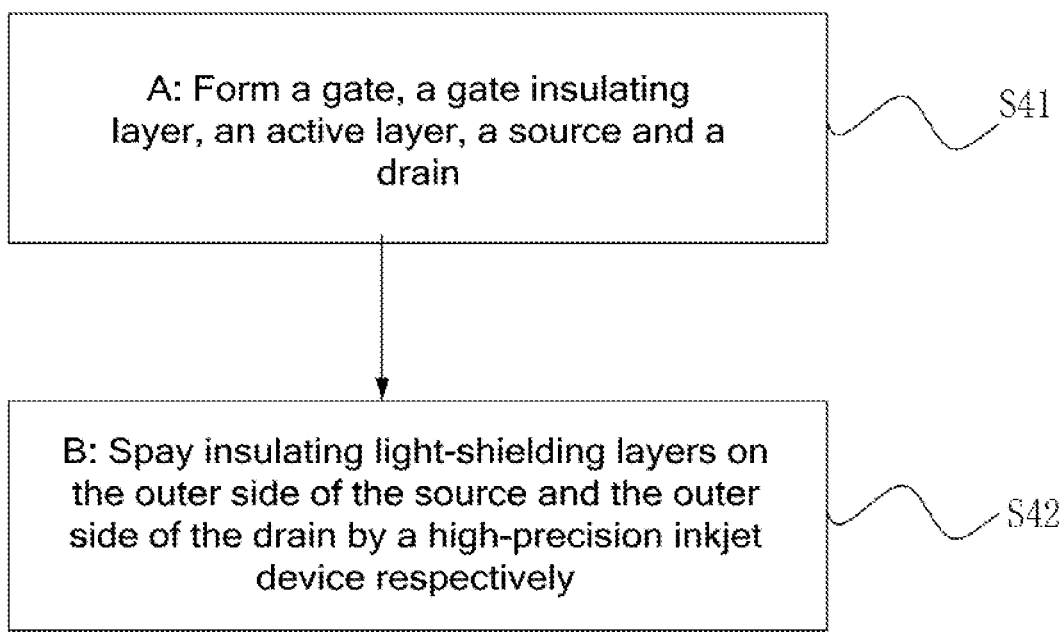
FIG. 4 is a method for manufacturing a first substrate of a display panel according to an embodiment of the present application.

Referring to FIG. 4, another embodiment of the present application also discloses a method for manufacturing a first substrate of a display panel, including the step of forming a thin film transistor on a first substrate 10;

the step of forming a thin film transistor on a first substrate includes the step of forming a gate, a gate insulating layer 30, an active layer 40, a source 50 and a drain 60;

where the step of forming a thin film transistor further includes the step of forming light shielding layers on the outer side of the source 50 and the outer side of the drain 60 of the thin film transistor in a direction away from the first substrate 10, the channel direction of the thin film transistor is the inner side direction, and the direction in which the source 50 and the drain 60 are away from the channel is the outer side direction.

In this embodiment, optionally, the light-shielding layer is an insulating light-shielding layer 70, where in the step of forming the insulating light-shielding layer 70, the insulating light-shielding layer 70 is formed and is in direct contact with the source 50 of the thin film transistor; and the insulating light-shielding layer 70 is formed and is in direct contact with the drain 60 of the thin film transistor.

In this solution, the source 50 and the drain 60 of the thin film transistor are in direct contact with the insulating light-shielding layer 70, and the direct contact is the closest, so that the light shielding effect is the best.

In this embodiment, optionally, in the step of forming the insulating light-shielding layer 70, in the outer side direction of the gate of the thin film transistor, the upper surface of the gate insulating layer 30 corresponding to one side of the source 50 and not covered with the source 50 is also provided with an insulating light-shielding layer 70.

The insulating light-shielding layer 70 on one side of the source 50 covers a wider range, which can better prevent light from entering and better reduce leakage current.

In this embodiment, optionally, in the step of forming the insulating light-shielding layer 70, in the outer side direction of the gate of the thin film transistor, the upper surface of the gate insulating layer 30 corresponding to one side of the drain 60 and not covered with the drain 60 is also provided with an insulating light-shielding layer 70.

The insulating light-shielding layer 70 on one side of the drain 60 covers a wider range, which can better prevent light from entering and better reduce leakage current.

In this embodiment, optionally, in the step of forming the insulating light-shielding layer 70, the upper surfaces of the source 50 and the drain 60 close to the channel are not provided with insulating light shielding layers 70.

The insulating light-shielding layer 70 on one side of the drain 60 covers a wider range, which can better prevent light from entering and better reduce leakage current.

In this embodiment, optionally, in the step of forming the insulating light shielding layers 70, an insulating light-shielding layer 70 is not disposed at the channel of the thin film transistor.

In this solution, the channel between the source 50 and the drain 60 is not provided with the insulating light-shielding layer 70, to avoid adverse effects on the channel region in the process of processing the insulating light-shielding layer 70; especially for the solution of adopting the high-precision inkjet device to form the insulating light-shielding layer 70 by jet, since the amorphous silicon in the channel is very sensitive to materials such as water, an additional protective layer is provided to protect the channel material, and the poor treatment may cause an increase in leakage current, resulting in image sticking (IS). Therefore, the insulating light-shielding layer 70 does not coat the channel of the thin film transistor, which has the least influence on the channel region, and the process is the simplest.

In this embodiment, in the step of forming the insulating light-shielding layer 70, both ends of the gate exceed the two ends of the corresponding source 50 and the drain 60.

In this solution, both ends of the gate exceed the two ends of the corresponding source 50 and drain 60, and the space in which the light can enter is relatively reduced, so that the entry of light can be better avoided.

In this embodiment, optionally, the step of forming a thin film transistor includes:

S41: Form a gate, a gate insulating layer 30, an active layer 40, a source 50 and a drain 60; and S42: Spay insulating light-shielding layers 70 on the outer side of the source 50 and the outer side of the drain 60 by a high-precision inkjet device, respectively.

The high-precision inkjet device has a minimum jet accuracy of 1 micron or less, and its machining accuracy is sufficient. The insulating light-shielding layer 70 is formed using a high-precision inkjet device, its operation process is simpler and the development is not exposed.

The panel of the present application may be a twisted nematic (TN) panel, an in-plane switching (IPS) panel, or a multi-domain vertical alignment (VA) panel, and of course, the panel may also be other types of panels, as long as the panels are suitable.

The above are further detailed descriptions of the present application in conjunction with the specific preferred embodiments, but the specific implementation of the present application cannot be determined as limited to these descriptions. For a person of ordinary skill in the art to which the present application pertains, a number of simple deductions or substitutions may also be made without departing from the concept of the present application. All these should be considered as falling within the scope of protection of the present application.

What is claimed is:

1. A display panel, comprising:
   a first substrate, which is provided with a thin film transistor;
   the thin film transistor comprises a gate, a gate insulating layer disposed on the gate, an active layer, a source and a drain;
   the channel direction of the thin film transistor is the inner side direction, and the direction in which the source and the drain are away from a channel is the outer side direction;
   the thin film transistor is provided with light-shielding layers on the outer side of the source and the outer side of the drain, respectively, in a direction away from the first substrate;
   wherein the insulating light-shielding layer is formed by jet with a high-precision inkjet device.

2. The display panel according to claim 1, wherein the light-shielding layer is an insulating light-shielding layer, the source of the thin film transistor is in direct contact with the insulating light-shielding layer, and the drain of the thin film transistor is in direct contact with the insulating light-shielding layer.

3. The display panel according to claim 2, wherein in the outer side direction of the gate of the thin film transistor, the upper surface of the gate insulating layer corresponding to one side of the source and not covered with the source is also provided with an insulating light-shielding layer.

4. The display panel according to claim 2, wherein in the outer side direction of the gate of the thin film transistor, the upper surface of the gate insulating layer corresponding to one side of the drain and not covered with the drain is also provided with an insulating light-shielding layer.

5. The display panel according to claim 2, wherein an insulating light-shielding layer is not disposed at the channel of the thin film transistor.

6. The display panel according to claim 1, wherein a portion of an upper surface of each of the source and the drain adjacent to the channel is not provided with an insulating light-shielding layer, and a portion of an upper surface of each of the source and the drain relatively far away from the channel is provided with an insulating light shielding layer.

7. The display panel according to claim 1, wherein an upper surface of each of the source and the drain is not provided with an insulating light-shielding layer, and the insulating light shielding layers are disposed only on the outer side of the source and the outer side of the drain.

8. The display panel according to claim 1, wherein the active layer comprises a doped layer and an amorphous silicon layer, and wherein the doped layer is located over the amorphous silicon layer.

9. The display panel according to claim 1, wherein the high-precision inkjet device has a jet precision of 1 micron.

10. A display panel, comprising:
    a first substrate, which is provided with a thin film transistor;
    a second substrate disposed corresponding to the first substrate;
    the thin film transistor comprises a gate, a gate insulating layer disposed on the gate, an active layer, a source and a drain;

the channel direction of the thin film transistor is the inner side direction, and the direction in which the source and the drain are away from a channel is the outer side direction;

in a direction far away from the first substrate, the thin film transistor is provided with an insulating light-shielding layer which is disposed on the outer side of the source and on the upper surface of the gate insulating layer corresponding to one side of the source and not covered with the source, an insulating light-shielding layer is disposed on the outer side of the drain and on the upper surface of the gate insulating layer corresponding to one side of the drain and not covered with the drain, and the insulating light-shielding layers are formed by jet with a high-precision inkjet device.

11. The display panel according to claim 10, wherein the high-precision inkjet device has a jet precision of 1 micron.

12. A method for manufacturing a first substrate of a display panel, comprising:
   forming a thin film transistor on a first substrate;
      the step of forming a thin film transistor on a first substrate comprises the step of forming a gate, a gate insulating layer, an active layer, a source and a drain;
      the step of forming a thin film transistor further comprises the step of forming light shielding layers on the outer side of the source and the outer side of the drain of the thin film transistor respectively in a direction away from the first substrate, wherein the channel direction of the thin film transistor is the inner side direction, and the direction in which the source and the drain are away from the channel is the outer side direction;
   wherein the step of forming light shielding layers on the outer side of the source and the outer side of the drain of the thin film transistor respectively in a direction away from the first substrate comprises:
      using a high-precision inkjet device to form an insulating light shielding layer by jet.

13. The method for manufacturing a first substrate of a display panel according to claim 12, wherein the step of forming light shielding layers on the outer side of the source and the outer side of the drain of the thin film transistor respectively in a direction away from the first substrate comprises:
   the light-shielding layer is an insulating light-shielding layer, the source of the thin film transistor is in direct contact with the insulating light-shielding layer, and the drain of the thin film transistor is in direct contact with the insulating light-shielding layer.

14. The method for manufacturing a first substrate of a display panel according to claim 12, wherein the step of forming light shielding layers on the outer side of the source and the outer side of the drain of the thin film transistor respectively in a direction away from the first substrate comprises:
   in the outer side direction of the gate of the thin film transistor, the upper surface of the gate insulating layer corresponding to one side of the source and not covered with the source is also provided with an insulating light-shielding layer.

15. The method for manufacturing a first substrate of a display panel according to claim 12, wherein the step of forming light shielding layers on the outer side of the source and the outer side of the drain of the thin film transistor respectively in a direction away from the first substrate comprises:
   in the outer side direction of the gate of the thin film transistor, the upper surface of the gate insulating layer corresponding to one side of the drain and not covered with the drain is also provided with an insulating light-shielding layer.

16. The method for manufacturing a first substrate of a display panel according to claim 12, wherein the step of forming light shielding layers on the outer side of the source and the outer side of the drain of the thin film transistor respectively in a direction away from the first substrate comprises:
   an insulating light-shielding layer is not disposed at the channel of the thin film transistor.

17. The method for manufacturing a first substrate of a display panel according to claim 16, wherein the step of forming light shielding layers on the miter side of the source and the outer side of the drain of the thin film transistor respectively in a direction away from the first substrate comprises:
   a portion of an upper surface of each of the source and the drain adjacent to the channel is not provided with an insulating light-shielding layer, and a portion of an upper surface of each of the source and the drain relatively far away from the channel is provided with an insulating light shielding layer.

18. The method for manufacturing a first substrate of a display panel according to claim 16, wherein the step of forming light shielding layers on the outer side of the source and the outer side of the drain of the thin film transistor respectively in a direction away from the first substrate comprises:
   a portion of an upper surface of each of the source and the drain is not provided with an insulating light-shielding layer, and the insulating light shielding layers are disposed only on the outer side of the source and the outer side of the drain.

19. The display panel according to claim 12, wherein the active layer comprises a doped layer and an amorphous silicon layer, and wherein the doped layer is located over the amorphous silicon layer.

20. The display panel according to claim 12, wherein the high-precision inkjet device has a jet precision of 1 micron.

* * * * *